United States Patent [19]
Storino et al.

[11] Patent Number: 6,163,173
[45] Date of Patent: Dec. 19, 2000

[54] METHOD AND APPARATUS FOR IMPLEMENTING ADJUSTABLE LOGIC THRESHOLD IN DYNAMIC CIRCUITS FOR MAXIMIZING CIRCUIT PERFORMANCE

[75] Inventors: Salvatore N. Storino; Gregory John Uhlmann; Robert Russell Williams, all of Rochester, Minn.

[73] Assignee: International Business Machines Corporation, Armonk, N.Y.

[21] Appl. No.: 09/305,704

[22] Filed: May 5, 1999

[51] Int. Cl.[7] .................................................. H03K 19/96
[52] U.S. Cl. ................................ 326/98; 326/121; 326/97
[58] Field of Search ................................ 326/98, 95, 171, 326/121, 97

[56] References Cited

U.S. PATENT DOCUMENTS 5,399,918   3/1995   Taylor et al. ............................ 326/110
5,483,181   1/1996   D'Souza ................................... 326/98
5,965,925   10/1999  Kornachuk et al. ..................... 257/401

*Primary Examiner*—David Nelms
*Assistant Examiner*—Thong Le
*Attorney, Agent, or Firm*—Joan Pennington

[57] ABSTRACT

Methods and apparatus are provided for implementing adjustable logic threshold in dynamic circuits. The dynamic circuit includes an intermediate precharge node. An output logic stage is connected to the intermediate precharge node. A threshold adjustment circuit is connected to the output logic stage. The threshold adjustment circuit receives a selection input to adjust a threshold of the output logic stage. The threshold adjustment circuit is formed of a first transistor and a second transistor coupled in parallel with a pair of series connected transistors included in the output logic stage. One or both of the first transistor and second transistor are selectively activated to adjust the threshold of the output logic stage.

16 Claims, 3 Drawing Sheets

METHOD AND APPARATUS FOR IMPLEMENTING ADJUSTABLE LOGIC THRESHOLD IN DYNAMIC CIRCUITS FOR MAXIMIZING CIRCUIT PERFORMANCE

FIELD OF THE INVENTION

The present invention relates to methods and apparatus for providing adjustable logic threshold in dynamic circuits to maximize circuit performance.

DESCRIPTION OF THE RELATED ART

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

As shown in FIG. 1, SOI semiconductors include a thin layer of silicon placed on top of an insulator, such as silicon dioxide ($SiO_2$) or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. With SOI technology faster MOS transistors can be manufactured resulting in higher performance semiconductors for faster electronic devices.

Referring to FIGS. 1 and 2, there is shown the SOI FET and the parasitic bipolar device. With SOI FETs, by placing a MOS transistor on top of a SOI layer, the MOS transistor is actually placed in parallel with a bipolar junction transistor, as illustrated in FIG. 2. If enough current is passed through the MOS transistor, the parasitic bipolar transistor will turn on. The parasitic bipolar transistor has a small current gain.

In general most dynamic circuits are either monotonic high or monotonic low. This is true for both conventional, bulk complementary metal oxide semiconductor (CMOS) and SOI dynamic circuits. A circuit that is monotonic high will initialize to a low condition and if logically true will switch to a high condition; this will occur once and only once per clock cycle. Also, the opposite holds for a circuit that is monotonic low. It will initialize to a high condition and if logically true will switch to a low condition. Every dynamic circuit is either monotonic high or monotonic low but never both. Because of this monotonic nature dynamic circuits are implemented in a fashion to favor one monotonic edge. This is accomplished by skewing the beta ratio of an output inverter contained in the dynamic circuit. However, there is a limit to how much skewing is possible before the circuit becomes unreliable. Ideally, the designer wants to approach the working limit.

A need exists to provide adjustable logic threshold in dynamic circuits to maximize circuit performance for both bulk complementary metal oxide semiconductor (CMOS) and SOI dynamic circuits.

SUMMARY OF THE INVENTION

A principal object of the present invention is to provide improved methods and apparatus for implementing adjustable logic threshold in dynamic circuits. Other objects are to provide such adjustable logic threshold dynamic circuits substantially without negative effects and that overcomes many of the disadvantages of prior art arrangements.

In brief, methods and apparatus are provided for implementing adjustable logic threshold in dynamic circuits. The dynamic circuit includes an intermediate precharge node. An output logic stage is connected to the intermediate precharge node. A logic threshold adjustment circuit is connected to the output logic stage. The logic threshold adjustment circuit receives a selection input for adjusting a threshold of the output logic stage.

In accordance with features of the invention, the logic threshold adjustment circuit includes a first transistor and a second transistor coupled in parallel with a pair of series connected transistors included in the output logic stage. One or both of the first transistor and second transistor are selectively activated to adjust the threshold of the output logic stage.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
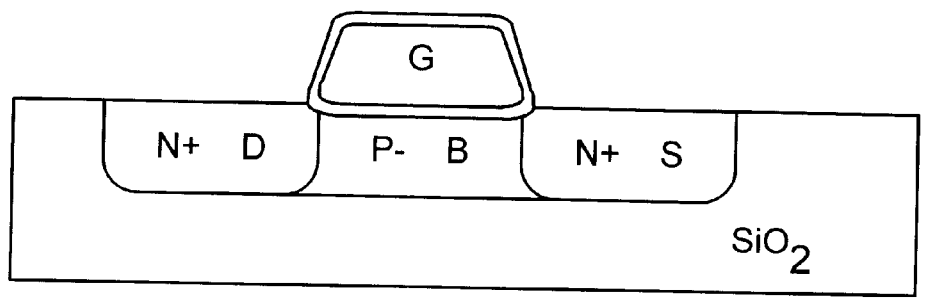
FIG. 1 is a cross sectional view illustrating a conventional silicon-on-insulator (SOI) N-channel field effect transistor (NFET)
Figure 2:
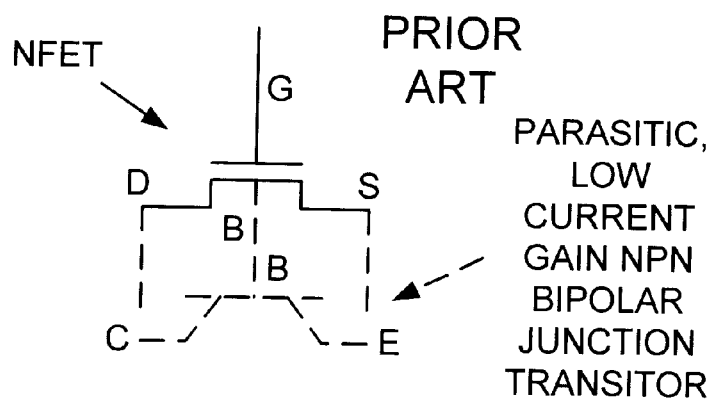
FIG. 2 is a schematic diagram illustrating the conventional silicon-on-insulator (SOI) N-channel field effect transistor (NFET) of FIG. 1 including a bipolar junction transistor.
Figure 3:
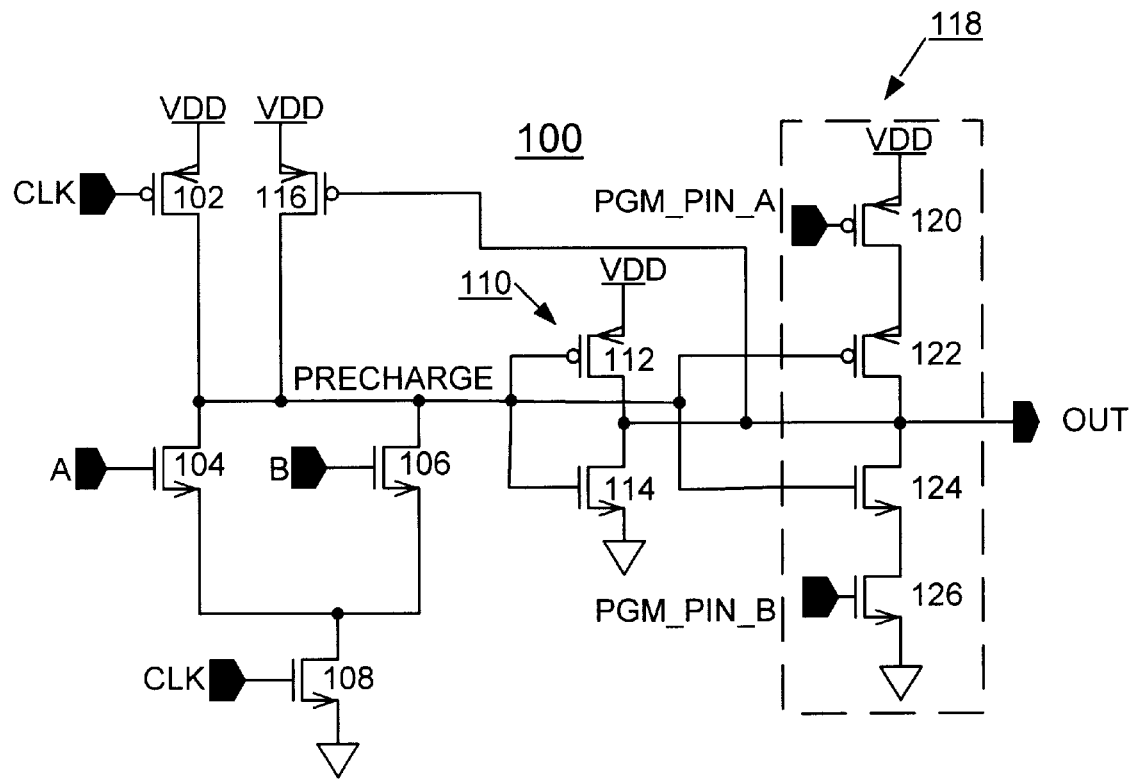
FIG. 3 is a schematic diagram illustrating an adjustable logic threshold dynamic circuit of the preferred embodiment.

Having reference now to the drawings, in FIG. 3, there is shown an adjustable logic threshold dynamic circuit generally designated by the reference character 100 of the preferred embodiment. Adjustable logic threshold dynamic circuit 100 includes a clocked precharge P-channel field effect transistor (PFET) 102. PFET 102 is connected between a supply voltage VDD and an intermediate precharge node labeled PRECHARGE. The gate of PFET 102 is connected to the clock signal input. PFET 102 is turned on during the precharge mode by the low clock signal. PFET 102 is turned off during the evaluate mode by the high clock signal. As shown in FIG. 3, adjustable threshold dynamic circuit 100 includes a pair of parallel connected input N-channel field effect transistors (NFETS) 104 and 106. The drains of input NFETs 104 and 106 are connected to the intermediate precharge node PRECHARGE. The gate NFET 104 is connected to the input source A. The gate NFET 106 is connected to the input source B. A clocked evaluate N-channel field effect transistor (NFET) 108 is connected between the sources of NFETs 104 and 106 and ground. The gate of evaluate NFET 108 is connected to the clock signal input. Evaluate NFET 108 is turned on during the evaluate mode by the high clock signal. Evaluate NFET 108 is turned off during the precharge mode by the low clock signal. The intermediate precharge node PRECHARGE is connected to an output logic stage or inverter 110 formed by a PFET 112 and a NFET 114 connected in series between the supply rail VDD and ground. An output of the adjustable threshold dynamic circuit 100 labeled OUT is provided at the connection of drains of PFET 112 and NFET 114. An optional weak feedback PFET 116 is connected between nodes OUT and PRECHARGE. The gate of optional feedback PFET is connected to node OUT. The drain of feedback PFET 116 is connected to node PRECHARGE and the source is connected to the supply voltage VDD.

It should be understood that principles of the present invention are not limited to the illustrated input logic stage arrangement. The present invention can be used with various arrangements of input transistors. For example, the illustrated arrangement of NFETs 104 and 106 show an example of a general input logic function. Also evaluate NFET 108 can be omitted.

Adjustable logic threshold dynamic circuit 100 includes a logic threshold adjustment circuit 118 of the preferred embodiment connected to the output inverter 110. Threshold adjustment circuit 118 is formed of a pair of series connected PFETs 120, 122 connected in series with a pair of series connected NFETs 124,126. Series connected PFETs 120, 122 and NFETs 124, 126 are connected between the supply voltage VDD and ground. The gates of the middle PFET 122 and NFET 124 are respectively connected to gates of PFET 112 and NFET 114. The drains of the middle PFET 122 and NFET 124 are respectively connected to drains of PFET 112 and NFET 114. The gates of the middle PFET 120 and NFET 126 are respectively connected to program select pins PGM_PIN_A and PGM_PIN_B. Dynamic circuit 100 can be either a conventional, bulk complementary metal oxide semiconductor (CMOS) or silicon-on-insulator (SOI) dynamic circuit.

In accordance with features of the invention, logic threshold adjustment circuit 118 allows the beta ratio of the inverter 110 to be selectively adjustable by increasing the effective widths of PFET 112 and NFET 114. Adjustable threshold dynamic circuit 100 allows a circuit designer to approach the lowest logic threshold in order to obtain the maximum performance. This is achieved by selectively adjusting the beta ratio of the inverter 110 in the dynamic circuit 100. For example, this is advantageous because under stress testing the environment conditions may generate artificially high noise levels that may cause the circuit to fail. Should this happen the beta ratio may be lowered during the stress testing to allow dynamic circuit 100 to be noise tolerant. After testing the ratio is raised to allow for maximum performance. All this can be done without any hardware alternations.

Initially, for example, the beta ratio of PFET 112 and NFET 114 is 6:1. By selecting the program pin called PGM_PIN_B the ratio of PFET 112 and NFET 114 is lowered to 4:1 whereby raising the threshold and making dynamic circuit 100 more noise immune. Similarly, by selecting the program pin PGM_PIN_A the ratio of PFET 112 and NFET 114 is raised to 7:1 whereby lowering the threshold and increasing the performance of the circuit. Lastly, if both pins PGM_PIN_A and PGM_PIN_B are selected the ratio of PFET 112 and NFET 114 is 3:1. Effectively, this invention allows the beta ratio to be adjusted from 7:1 to 3:1 range. By selection the program pins, the circuit 100 can be adjusted from high performance and low noise rejection characteristics to low performance and high noise rejection characteristics.

Figure 4:
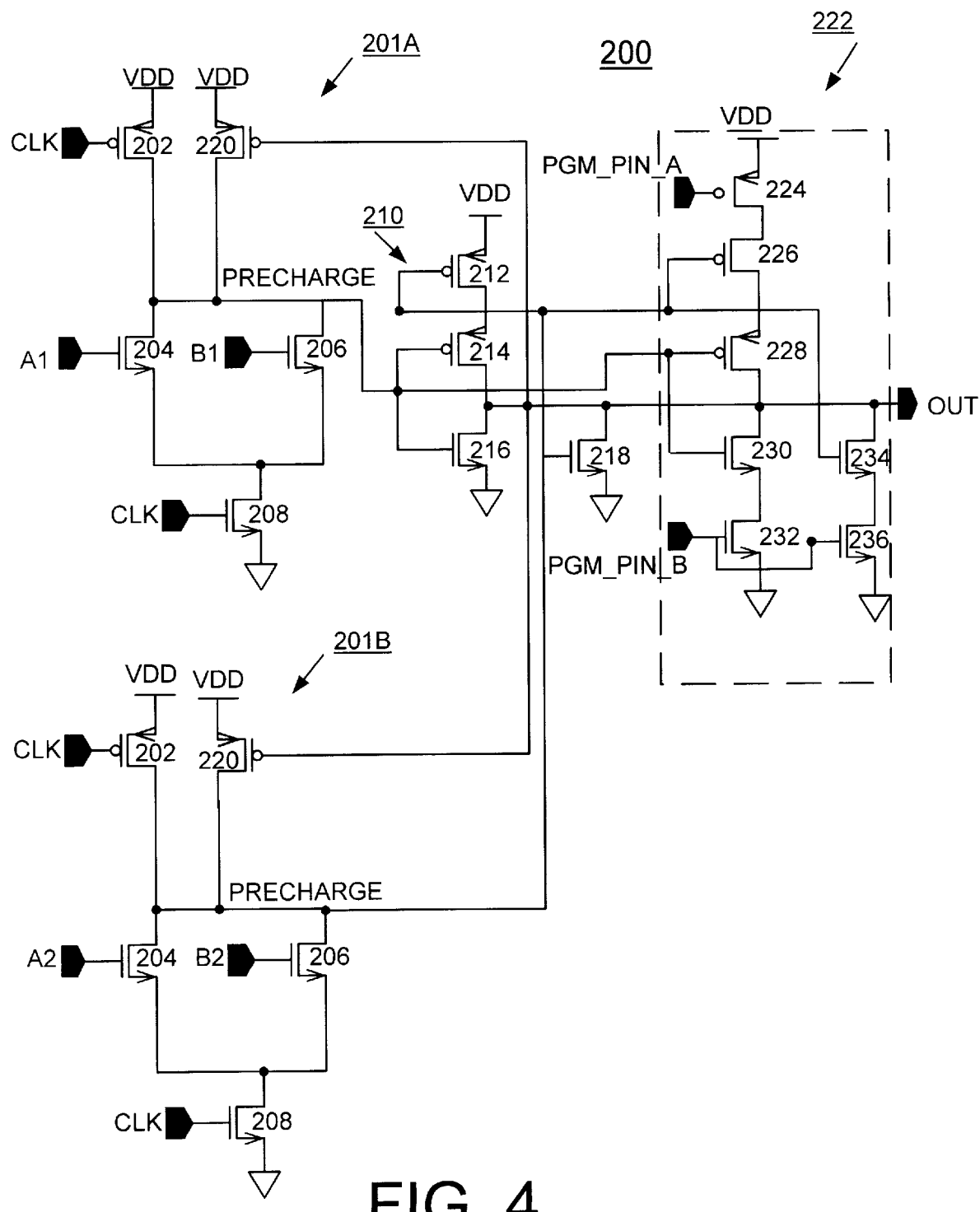
FIG. 4 is a schematic diagram illustrating another adjustable logic threshold dynamic circuit of the preferred embodiment.

Having reference now to FIG. 4, there is shown a further adjustable logic threshold dynamic circuit generally designated by the reference character 200 of the preferred embodiment. Adjustable logic threshold dynamic circuit 200 includes a pair of dynamic logic input circuits 201A and 201B. Each of the dynamic logic input circuits 201A and 201B includes a clocked precharge P-channel field effect transistor (PFET) 202. PFET 202 is connected between a supply voltage VDD and a respective intermediate precharge node labeled PRECHARGE. The gate of PFET 202 is connected to the clock signal input. PFET 202 is turned on during the precharge mode by the low clock signal. PFET 202 is turned off during the evaluate mode by the high clock signal. Each dynamic logic input circuit 201A and 201B includes a pair of parallel connected input N-channel field effect transistors (NFETs) 204 and 206. The drains of input NFETs 204 and 206 are connected to the respective intermediate precharge node PRECHARGE. The gate NFET 204 is connected to the input source A. The gate NFET 206 is connected to the input source B. A clocked evaluate N-channel field effect transistor (NFET) 208 is connected between the sources of NFETs 204 and 206 and ground. The gate of evaluate NFET 208 is connected to the clock signal input. Evaluate NFET 208 is turned on during the evaluate mode by the high clock signal. Evaluate NFET 208 is turned off during the precharge mode by the low clock signal. The respective intermediate precharge nodes PRECHARGE of the dynamic logic input circuits 201A and 201B are connected to an output logic state 210.

Output logic state 210 comprises a compound NOR formed by a pair of PFETs 212 and 214 and a pair of NFETs 216 and 218 connected in series between the supply rail VDD and ground. An output of the adjustable threshold dynamic circuit 200 labeled OUT is provided at the connection of drains of PFET 214 and NFETs 216 and 218. An optional weak feedback PFET 220 is connected between node OUT and the respective nodes PRECHARGE of the dynamic logic input circuits 201A and 201B. The gate of each feedback PFET 220 is connected to node OUT. The drain of feedback PFET 116 is connected to the respective node PRECHARGE and the source is connected to the supply voltage VDD.

Adjustable logic threshold dynamic circuit 200 includes a logic threshold adjustment circuit 222 of the preferred embodiment connected to the compound NOR 210. Threshold adjustment circuit 222 is formed of a plurality of series connected PFETs 224, 226, 228 and a plurality of NFETs 230, 232, 234 and 236. Series connected PFETs 224, 226, 228 and NFETs 230, 232 are connected in series between the supply voltage VDD and ground. NFETs 234 and 236 are connected in series between the node OUT and ground. The gates of the PFET 228 and NFET 230 are respectively connected to gates of PFET 214 and NFET 216 and to the node PRECHARGE of the dynamic logic input circuits 201A. The gates of the PFET 226 and NFET 234 are connected to gate of PFET 212 and to the node PRECHARGE of the dynamic logic input circuits 201B. The drains of the PFET 228 and NFET 230 are respectively connected to drains of PFET 214 and NFET 216. The gates of the PFET 224 and NFETs 232 and 236 are respectively connected to program select pins PGM_PIN_A and PGM_PIN_B.

In accordance with features of the invention, logic threshold adjustment circuit 218 allows the beta ratio of the compound NOR 210 to be selectively adjustable by increasing the effective widths of PFETs 212, 214 and NFETs 216, 218. Adjustable threshold dynamic circuit 200 allows a circuit designer to approach the lowest logic threshold in order to obtain the maximum performance. This is achieved by selectively adjusting the beta ratio of the compound NOR 210 in the dynamic circuit 200. By selection the program pins, the circuit 200 similarly can be adjusted from high performance and low noise rejection characteristics to low performance and high noise rejection characteristics.

Dynamic circuit 200 also can be either a conventional, bulk complementary metal oxide semiconductor (CMOS) or silicon-on-insulator (SOI) dynamic circuit. It should be understood that principles of the present invention are not limited to the illustrated dynamic circuits 100 and 200 of FIGS. 3 and 4. It should be understood that dynamic circuits 100 and 200 can include a single selection input of either PGM_PIN_A or PGM_PIN_B rather than both PGM_PIN_A and PGM_PIN_B. It should be understood that dynamic circuits 100 and 200 can include other arrangements of dynamic logic input circuits.

While the present invention has been described with reference to the details of the embodiments of the invention shown in the drawing, these details are not intended to limit the scope of the invention as claimed in the appended claims.

What is claimed is:

1. A dynamic circuit comprising:
   an intermediate precharge node;
   an output logic stage connected to said intermediate precharge node and providing an output;
   a logic threshold adjustment circuit connected to said output logic stage; said logic threshold adjustment circuit receiving a selection input to adjust a logic threshold of said output logic stage;
   said logic threshold adjustment circuit including a plurality of series connected P-channel field effect transistors (PFETs) connected in series with a plurality of series connected N-channel field effect transistors (NFETs); said plurality of PFETs and said plurality of NFETs being coupled between a supply voltage and ground potential with a source terminal of a top one of said PFETs coupled to a supply voltage, and a source terminal of a bottom one of said NFETs coupled to a ground connection; a drain of a common connected ones of said series connected PFETs and NFETs being coupled to said output node and a gate terminal of common connected ones of said series connected PFETs and NFETs being coupled to said intermediate precharge node; both said top one of said PFETs and said bottom one of said NFETs having a gate input selectively receiving said selection input to adjust a logic threshold of said output logic stage.

2. The dynamic circuit as recited in claim 1 wherein said output logic stage includes a pair of series connected transistors.

3. The dynamic circuit as recited in claim 2 wherein said common connected ones of said series connected PFETs and NFETs of said logic threshold adjustment circuit are coupled in parallel with said pair of series connected transistors of said output logic stage.

4. The dynamic circuit as recited in claim 2 wherein said pair of series connected transistors comprise a P-channel field effect transistor (PFET) connected in series with an N-channel field effect transistor (NFET); and wherein said PFET and NFET are coupled between a supply voltage and ground potential and a gate terminal of both said PFET and NFET is coupled to said intermediate precharge node; a source terminal of said PFET is coupled to a supply voltage, a drain terminal of both said PFET and NFET is coupled to an output node, and a source terminal of said NFET is coupled to a ground connection.

5. The dynamic circuit as recited in claim 4 wherein said PFET and NFET of said output logic stage are silicon-on-insulator (SOI) transistors.

6. A dynamic circuit comprising:
   an intermediate precharge node;
   an output logic stage connected to said intermediate precharge node;
   a logic threshold adjustment circuit connected to said output logic stage; said threshold adjustment circuit receiving a selection input to adjust a logic threshold of said output logic stage;
   said output logic stage includes a pair of series connected transistors; said pair of series connected transistors includes a P-channel field effect transistor (PFET) connected in series with an N-channel field effect transistor (NFET); and said PFET and NFET are coupled between a supply voltage and ground potential and a gate terminal of both said PFET and NFET is coupled to said intermediate precharge node; a source terminal of said PFET is coupled to a supply voltage, a drain terminal of both said PFET and NFET is coupled to an output node, and a source terminal of said NFET is coupled to a ground connection;
   said logic threshold adjustment circuit includes a first transistor and a second transistor coupled in parallel with said PFET and NFET of said output logic stage; and
   said logic threshold adjustment circuit includes a third transistor coupled between said first transistor of said threshold adjustment circuit and a supply voltage.

7. The dynamic circuit as recited in claim 6 wherein said logic threshold adjustment circuit includes a forth transistor coupled between said NFET of said threshold adjustment circuit and a ground connection.

8. The dynamic circuit as recited in claim 7 wherein said third transistor and said forth transistor of said logic threshold adjustment circuit receives said selection input to adjust said threshold of said output logic stage.

9. The dynamic circuit as recited in claim 2 wherein said third transistor is a PFET and said forth transistor is a NFET and wherein said selection input is selectively applied to a gate terminal of said third transistor and said forth transistor to adjust said threshold of said output logic stage.

10. A method for providing threshold adjustment of a dynamic circuit, the dynamic circuit having an intermediate precharge node and an output logic stage including a pair of series connected transistors coupled to the intermediate precharge node, said pair of series connected transistors including a P-channel field effect transistor (PFET) connected in series with an N-channel field effect transistor (NFET); and said PFET and NFET are coupled between a supply voltage and ground potential and a gate terminal of both said PFET and NFET is coupled to said intermediate precharge node; a source terminal of said PFET is coupled to a supply voltage, a drain terminal of both said PFET and NFET is coupled to an output node, and a source terminal of said NFET is coupled to a ground connection said method comprising the steps of:
   coupling a logic threshold adjustment circuit in parallel with the pair of series connected transistors of the output logic stage including providing said logic threshold adjustment circuit with a first transistor and a second transistor coupled in parallel with said PFET and NFET of the output logic stage; and a third transistor coupled between said first transistor and a supply voltage; and providing a selection signal for selectively activating said third transistor of said logic threshold adjustment circuit.

11. The method for providing threshold adjustment of a dynamic circuit as recited in claim 10 wherein the step of coupling said logic threshold adjustment circuit in parallel with the pair of series connected transistors of the output logic stage includes the steps of providing said logic threshold adjustment circuit with a fourth transistor coupled between said second transistor and ground.

12. The method for providing threshold adjustment of a dynamic circuit as recited in claim 11 wherein the step of providing said selection signal for selectively activating said logic threshold adjustment circuit further includes the steps of selectively activating said fourth transistor.

13. The method for providing threshold adjustment of a dynamic circuit as recited in claim 12 wherein the step of providing said selection signal for selectively activating said logic threshold adjustment circuit includes the steps of selectively activating one of said third transistor and said fourth transistor.

14. A dynamic circuit comprising:

an intermediate precharge node;

an output logic stage connected to said intermediate precharge node; said output logic stage including a pair of series connected transistors including a P-channel field effect transistor (PFET) connected in series with an N-channel field effect transistor (NFET); said PFET and NFET being coupled between a supply voltage and ground potential and a gate terminal of both said PFET and NFET being coupled to said intermediate precharge node; a source terminal of said PFET being coupled to a supply voltage, a drain terminal of both said PFET and NFET being coupled to an output node, and a source terminal of said NFET being coupled to a ground connection; and a logic threshold adjustment circuit connected to said output logic stage; said threshold adjustment circuit receiving a selection input to adjust a logic threshold of said output logic stage, said threshold adjustment circuit including a first PFET coupled in parallel with said PFET of said output logic stage and a first NFET coupled in parallel with said NFET of said output logic stage; and said logic threshold adjustment circuit includes a second PFET coupled between said first PFET of said threshold adjustment circuit and a supply voltage and a second NFET coupled between said first NFET of said threshold adjustment circuit and ground; and said second PFET and said second NFET selectively receiving said selection input to adjust said logic threshold of said output logic stage.

15. The dynamic circuit as recited in claim 14 wherein said first PFET coupled in parallel with said PFET of said output logic stage is selectively activated responsive to said selection input selectively received by said second PFET and said second NFET.

16. The dynamic circuit as recited in claim 14 wherein said first NFET coupled in parallel with said NFET of said output logic stage is selectively activated responsive to said selection input selectively received by said second PFET and said second NFET.

* * * * *